United States Patent  
Rice et al.

(10) Patent No.: US 6,198,346 B1
(45) Date of Patent: Mar. 6, 2001

(54) ADAPTIVE LINEAR AMPLIFIER WITHOUT OUTPUT POWER LOSS

(75) Inventors: Christopher W. Rice, Parsippany, NJ (US); Irene Triantafillou, Bayside, NY (US)

(73) Assignee: AT&T Corp., New York, NY (US)

(*) Notice: Subject to any disclaimer, the term of this patent is extended or adjusted under 35 U.S.C. 154(b) by 0 days.

(21) Appl. No.: 09/195,078

(22) Filed: Nov. 18, 1998

(51) Int. Cl.[7] .......................................... H03F 3/66
(52) U.S. Cl. .................................. 330/52; 330/149
(58) Field of Search .............................. 330/52, 149, 151

(56) References Cited

U.S. PATENT DOCUMENTS

| | | | |
|---|---|---|---|
| 4,389,618 | * | 6/1983 | Bauman ................................ 330/149 |
| 4,394,624 | * | 7/1983 | Bauman ................................ 330/149 |
| 4,580,105 | * | 4/1986 | Myer .................................... 330/149 |
| 5,307,022 | * | 4/1994 | Tattersall, Jr. et al. ............... 330/52 |
| 5,491,454 | * | 2/1996 | Matz .................................... 330/149 |
| 5,574,400 | * | 11/1996 | Fukuchi ................................ 330/52 |
| 5,594,385 | * | 1/1997 | Anvari ................................. 330/149 |
| 5,774,018 | * | 6/1998 | Gianfortune et al. .................. 330/52 |
| 5,877,653 | * | 3/1999 | Kim et al. ............................ 330/149 |
| 5,912,586 | * | 6/1999 | Mitzlaff ............................... 330/149 |
| 5,917,375 | * | 6/1999 | Lisco et al. .......................... 330/149 |
| 5,926,067 | * | 7/1999 | Myer et al. .......................... 330/52 |

* cited by examiner

*Primary Examiner*—Robert Pascal
*Assistant Examiner*—Khanh Van Nguyen

(57) ABSTRACT

A multi-tone signal amplifier topology and an amplifying method in which a first amplifier outputs a first signal having at least one fundamental frequency signal and a first distortion signal. A second amplifier outputs a second signal that has a fundamental frequency signal corresponding to each fundamental frequency signal of the first signal and a second distortion signal. Each fundamental frequency signal of the second signal is substantially in-phase with the corresponding fundamental frequency signal of the first signal, while the second distortion signal is substantially 180° out-of-phase with the first distortion signal. An output coupler combines the first and second signals to form a third signal having the corresponding fundamental frequency signals of the first and second signals constructively combined and a third distortion signal that is a difference between the first distortion signal and the second distortion signal. A detector, coupled to the third signal, generates a control signal applied to the second amplifier for adjusting at least one of an amplitude and a phase of the second distortion signal thereby minimizing the third distortion signal. The second amplifier circuit includes an adjust circuit that varies at least one of an amplitude and a phase of the input signal for the second amplifier in response to the control signal.

17 Claims, 2 Drawing Sheets

ADAPTIVE LINEAR AMPLIFIER WITHOUT OUTPUT POWER LOSS

BACKGROUND OF THE INVENTION

1. Field of the Invention

The present invention relates to radio frequency (RF) amplifiers. More particularly, the present invention relates to a multi-tone amplifier and a method for amplifying having adaptive closed-loop control for minimizing intermodulation distortion products, and for minimizing amplifier performance degradation caused by component drift, temperature variation and aging.

2. Description of the Related Art

As is well-known, when a dual or multi-tone input signal is applied to an amplifier that is not perfectly linear, undesirable intermodulation (IM) products are generated at predictable frequencies causing intermodulation distortion (IMD). Amplifiers operating in class AB or class B modes tend to produce high levels of IMD product when multi-frequency signals—that is, multi-tone signals—are amplified. IM product levels on the order of −30 dBc (30 decibels below the fundamental frequency or carrier level) are typical. The undesirable IM products are particularly apparent when the amplifier is operated in saturation or in the gain compression region of the amplifier. The level of the IM products are greater the further into the gain compression region the amplifier is operated.

Harmonic IM products are not of primary concern because they can be removed by a filter. Third order and fifth order IM products, however, fall within the desired communication bandwidth of the amplifier and cannot be removed by a filter. The only way to deal with the third and fifth order intermodulation products is to amplify in a way that does not generate third and fifth order intermodulation products.

A conventional technique for reducing intermodulation distortion (IMD) is to use a correction amplifier that generates correction signals at the same frequencies as the undesirable intermodulation (IM) products, but having phases that are 180° out-of-phase from the phases of the corresponding IM products. When the IM products and the correction signals are applied to an output combiner, the IM products are cancelled by vector summation with the correction signals. As a result, the amplified output signal has substantially only the fundamental input signal frequencies, i.e., the multi-tone components of the input signal.

FIG. 1 shows a schematic block diagram of a conventional low-distortion RF amplifier circuit 10 that includes a correction amplifier. Circuit 10 linearly amplifies an input signal $S_{IN}$ to produce an amplified output signal $S_{OUT}$. Input signal $S_{IN}$ is a dual-tone high-frequency signal having sinusoidal components at a first fundamental frequency f1 and at a second fundamental frequency f2. For this description, frequency f2 is greater than frequency f1. Both frequencies f1 and f2 are within standard wireless communication frequency bands, such as between 800–960 MHz. The phase of $S_{IN}$ is arbitrary. Amplification causes IM products to occur at both higher and lower frequencies than the communication frequency band of interest.

In FIG. 1, frequency components f1 and f2 of $S_{IN}$ and various other signals are shown vectorally for conveniently showing phase relationships between the same frequency components at specific points within circuit 10. Power and voltage standing wave ratio (VSWR) losses are ignored in the following description.

Input signal $S_{IN}$ is applied to an input port 11 of a first coupler, or power splitter, C1. Coupler C1 splits signal $S_{IN}$ into a signal S1 that is output at a "direct path" output port 12 and a signal S2 that is output at a "coupled path" output port 13. Typically, coupler C1 is a passive device, such as conventional branch line coupler or Wilkinson-type divider, that splits input power unequally between output ports 12 and 13, with higher power being output at port 12.

Signal S1 includes sinusoidal components at frequencies f1 and f2 having respective voltage levels of $C_{11}V_1$ and $C_{11}V_2$, where $C_{11}$ is the coupling coefficient of coupler C1. The phases of the f1 and f2 components of signal S1 are defined to be 0°. Similarly, signal S2 includes sinusoidal components at frequencies f1 and f2 having respective voltage levels $V_1\sqrt{1-C_{11}^2}$, and having respective phases also defined to be 0°.

Signal S1 is applied to a power amplifier A1 where it is amplified to produce an amplified signal S3 output at an amplifier output port 14. Amplifier A1 is a conventional high-frequency amplifier operating in class A, AB or B; for example, a power gain on the order of 30 dB to produce RF output power of about 50 W.

Amplified signal S3 contains amplified frequency components f1 and f2 and undesirable intermodulation distortion products at frequencies f3 and f4. Frequency f3 is at 2f1−f2, and is less than frequency f1. Frequency f4 is at 2f2−f1, and is greater than frequency f2. The components of signal S3 at frequencies f1 and f2 are $G1C_{11}V_1$ and $G1C_{11}V_2$, respectively, where G1 is the voltage gain of amplifier A1. The phases of the f1 and f2 components of S3 are $-\phi_{10}$ and $-\phi_{20}$, respectively, where $-\phi_{10}$ and $-\phi_{20}$ are the respective insertion phase lags through amplifier A1 at frequencies f1 and f2. The minus sign indicates a phase lag or delay. The intermodulation distortion components of signal S3 at frequencies f3 and f4 have respective voltage levels $V_3$ and $V_4$ with respective reference phase values of $-\phi_{30}$ and $-\phi_{40}$.

Signal S3 is applied to an input port 15 of a coupler C2, such as a conventional hybrid (e.g., branch line), a backward firing or a Wilkinson coupler. Coupler C2 has a coupling coefficient of $C_{22}$ that is typically in the range of −10 to −20 dB. A coupled-path signal S4 is output from a coupling port 16 and is, for example, 10 to 20 dB below the level of a direct-path signal S8 that is output from a direct port 17. The voltage levels of the frequency components of signal S4 are each $C_{22}$ times the corresponding voltage levels of the signal S3 frequency components. The voltage levels of the components of signal S8 are $\sqrt{1-C_{22}^2}$ times the corresponding voltage levels of the components of signal S3. The respective phases $-\phi_{11}$ to $-\phi_{41}$ of the frequency components f1–f4 of signal S4 are the same as the phases of the corresponding frequency components of signal S8. Specifically, phase values $-\phi_{11}$ and $-\phi_{12}$ are the combination of the insertion phase lags $-\phi_{10}$ and $-\phi_{20}$ through amplifier A1, respectively, plus the respective insertion phase lags at frequencies f1 and f2 through coupler C2. Phase values $-\phi_{31}$ and $-\phi_{41}$ are the insertion phase lags at the respective frequency f3 and f4 through coupler C2, plus the phase lag through amplifier A1.

Coupled-path signal S4 is applied to a phase shifter 18, such as a variable capacitor-type phase shifter, PIN diode phase shifter or a Shiffman phase shifter, for introducing a 180° phase shift at each of the frequencies f1–f4. A signal S5 output from phase shifter 18 is input to a coupled port 19 of a coupler C3. Signal S5 contains the same frequency components f1–f4 at the same voltage levels as signal S4, but with the phase of each respective component shifted by 180° from the corresponding components of signal S4. Specifically, the voltage levels of the f1 and f2 components of signal S5 are $C_{22}G1C_{11}V_1$ and $C_{22}G1C_{11}V_2$, respectively, and the respective phases are $-\phi_{11}-180°$ and $-\phi_{21}-180°$. The voltage levels of the f3 and f4 components of signal S5 are $C_{22}V_3$ and $C_{22}V_4$, respectively, and the respective phases are $-\phi_{31}-180°$ and $-\phi_{41}-180°$.

Signal S2 is input to a delay line DL1, which outputs a signal S6. Signal S6 is input to a port 20 of coupler C3. Delay line DL1 introduces phase lags of $-\phi_{11}$ and $-\phi_{21}$ at respective frequencies f1 and f2, equalling the insertion phase lags through amplifier A1 plus coupler C2 at frequencies f1 and f2. Thus, the f1 and f2 frequency components of signal S6 are 180° out-of-phase with the f1 and f2 frequency components of signal S5.

Coupler C3 substantially subtracts signal S5 from signal S6 to produce a signal S7 having signal components f1–f4. In this case, the f1 and f2 components of signal S7 have respective phase values that are equal to the phase of f1 and f2 components of signal S5 or S6, depending on the cancellation in coupler C3. The voltage levels of the f1 and f2 components of signal S7 are ($\sqrt{1-C_{22}^2}\sqrt{1-C_{22}^2}-C_{33}C_{11}C_{22}G1$) times $V_1$ and $V_2$, respectively, where $C_{33}$ is the coupling coefficient of coupler C3. Coupler C3 also produces the f3 and f4 components of signal S7 at voltage levels of $C_{33}C_{22}V_3$ and $C_{33}C_{22}V_4$, respectively, with respective phase values of $-\phi_{32}$ and $-\phi_{42}$.

Signal S7 is applied to the input of an amplifier A2. The respective voltage or power levels of signal S7 at frequencies f1 and f2 are below the corresponding power levels of signal S1 as a function of the cancellation in coupler C3. Amplifier A2 outputs a signal S9. The gain G2 of amplifier A2 is selected such that the f3 and f4 terms cancel at the output.

Signal S9 also contains distortion components at distortion frequencies f3 and f4, respectively designated as "f3,S9" and "f4,S9", that are primarily the result of the amplification of the corresponding distortion frequency components of signal S7. A signal S10, which is signal S8 delayed by a delay line DL2, contains distortion frequency components at respective frequencies f3 and f4 and respectively "f3,S10" and "f4,S10". Signal S10 also contains fundamental frequency components "f1,S10" and "f2,S10" at respective frequencies f1 and f2.

Output combiner 22 adds the f1 and f2 frequency components when the respective phases of f1,S9 and f2,S9 equal the corresponding phases of f1,S10 and f2,S10, and when the corresponding voltage levels of S9 and S10 are equal. Delay line DL2 equalizes the phases by adding an insertion phase lag that equals the insertion phase lag through amplifier A2 and through the path between ports 20 and 21 of coupler C3. Delay line DL2 also compensates for the insertion phases of the distortion products of signal S5 through coupler C3 and for the distortion products of signal S7 through amplifier A2 at f3 and f4.

Output combiner 22 receives signals S9 and S10 at ports 23 and 24, respectively. Combiner 22, such a 3 dB Wilkinson-type coupler, cancels the distortion frequency power within signals S9 and S10 adding the two signals 180° out-of-phase. Similarly, when two equal amplitude, but in-phase components are applied to ports 23 and 24, all of the power appears at the output port 25, and is without distortion components at frequencies f3 and f4 in the ideal case.

While this conventional RF amplifier topology ideally eliminates distortion products, the conventional RF amplifier topology does not provide closed-loop control, manifesting itself by degraded performance caused by changes in component characteristics resulting from, for example, temperature variations and by component aging. What is needed is an RF amplifier topology that provides simple closed-loop control for both loops, thus eliminating performance degradation as component characteristics change with temperature variations and component aging.

SUMMARY OF THE INVENTION

The present invention provides an RF amplifier topology having closed-loop control and eliminating performance degradation as component characteristics drift caused by temperature variations and component aging.

The advantages of the present invention are provided by a multi-tone signal amplifier topology and an amplifying method in which a first amplifier outputs a first signal having at least one fundamental frequency signal and a first distortion signal. A first coupler is coupled to the first signal and outputs a first coupled signal. A phase shifter, coupled to the first coupled signal, outputs a phase-delayed first coupled signal that is phase delayed by substantially a 180° phase delay. A second coupler is coupled to the phase-delayed first coupled signal and outputs at least a portion of an input signal for a second amplifier.

The second amplifier outputs a second signal that has a fundamental frequency signal corresponding to each fundamental frequency signal of the first signal and a second distortion signal. Each fundamental frequency signal of the second signal is substantially in-phase with the corresponding fundamental frequency signal of the first signal, while the second distortion signal is substantially 180° out-of-phase with the first distortion signal. An output coupler combines the first and second signals to form a third signal having the corresponding fundamental frequency signals of the first and second signals constructively combined and a third distortion signal that is a difference between the first distortion signal and the second distortion signal. Each fundamental frequency signal of both the first and second signals has a first power level, such that each fundamental frequency signal of the third signal has a power level that is substantially twice the first power level.

A detector, coupled to the third signal, generates a control signal applied to the second amplifier for adjusting at least one of an amplitude and a phase of the second distortion signal for minimizing the third distortion signal. The second amplifier circuit includes an adjust circuit that varies at least one of an amplitude and a phase of the input signal for the second amplifier in response to the control signal.

According to the invention, the first signal includes a first spread inject signal, and the second signal includes a second spread inject signal. The detector detects the first spread inject signal and the second spread inject signal and generates the control signal based on the detected first spread inject signal and the second spread inject signal.

BRIEF DESCRIPTION OF THE DRAWING

The present invention is illustrated by way of example and not limitation in the accompanying figures in which like reference numerals indicate similar elements and in which.

DETAILED DESCRIPTION

The present invention provides an RF amplifier topology having close-loop control that cancels undesired amplifier intermodulation products that are caused by the nonlinear nature of an RF amplifier, while simultaneously providing the ability to monitor the degree of cancellation of the intermodulation products, that is, the level of non-linearity of the amplifier circuit. Further, the amplifier topology of the present invention provides an adjustment for changes in component characteristics caused by, for example, temperature variations and component aging, thereby obtaining optimal linearity performance of an RF amplifier.

Figure 1:
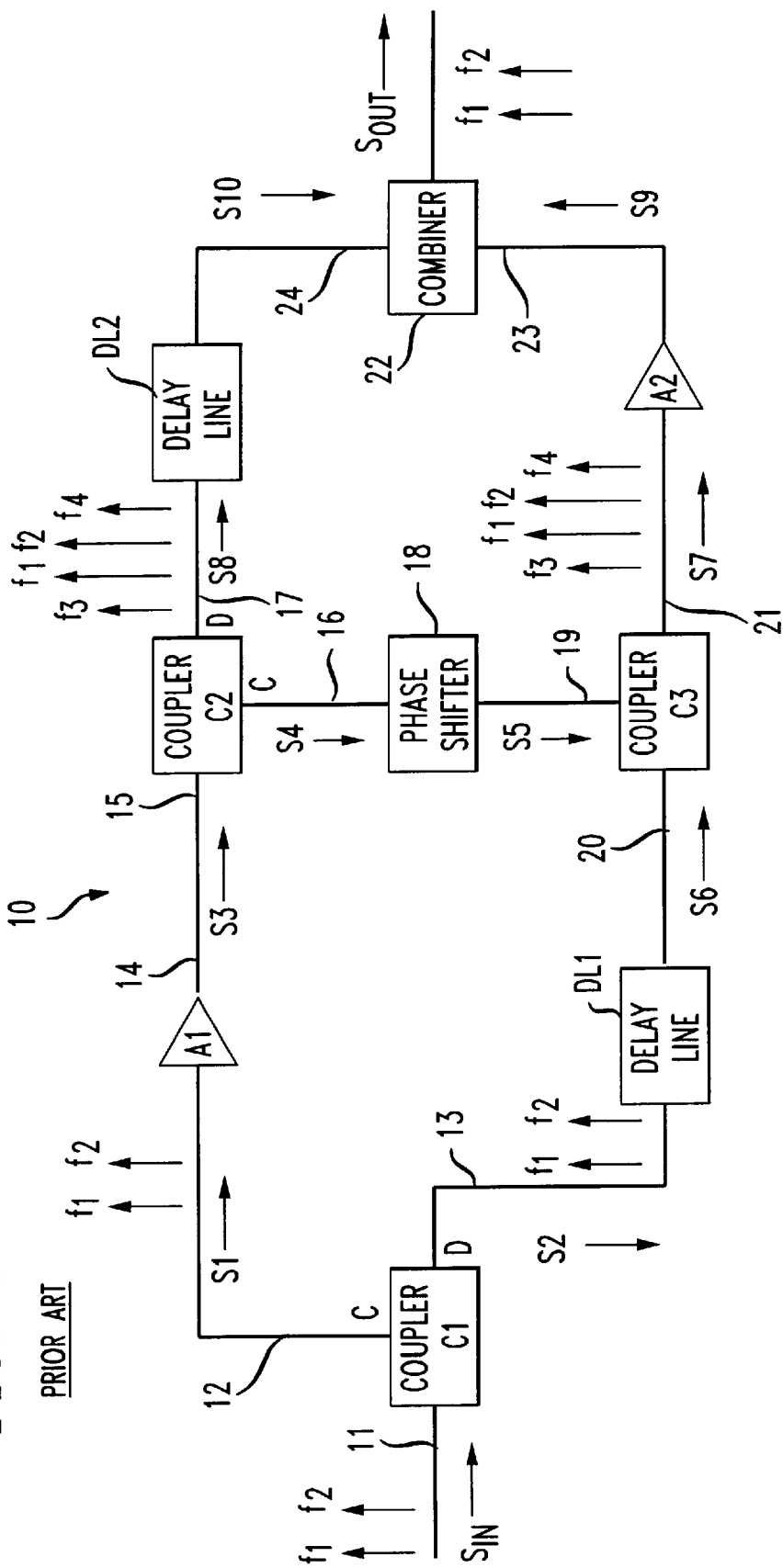
FIG. 1 shows a schematic block diagram of a conventional low-distortion RF amplifier topology for linearly amplifying an input signal.
Figure 2:
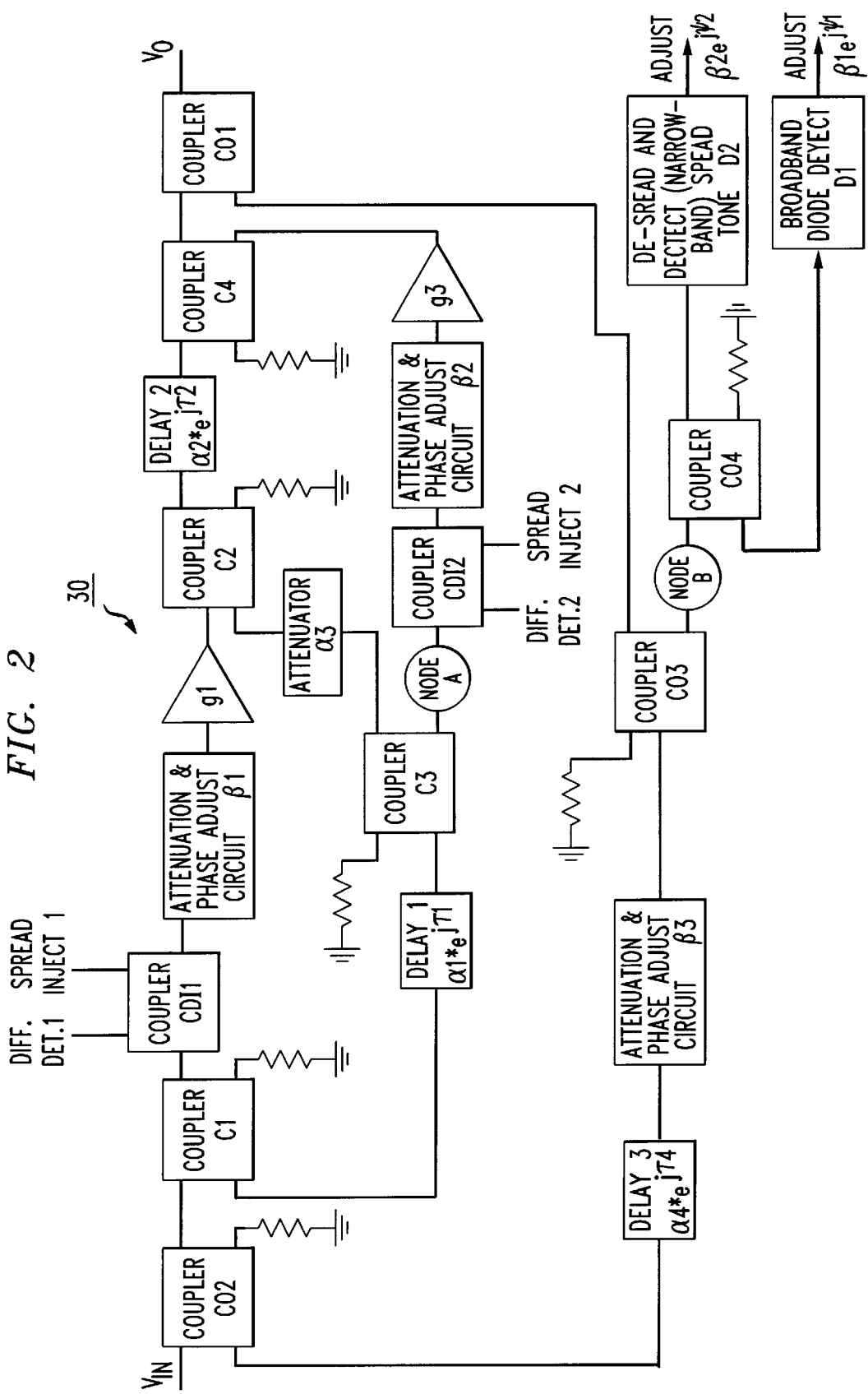
FIG. 2 shows a schematic block diagram of a linear RF amplifier topology having closed-loop control according to the present invention.

FIG. 2 shows a schematic block diagram of a linear RF amplifier topology 30 having closed-loop control according to the present invention. Amplifier topology 30 is described herein for convenience as a low-distortion amplifier for amplifying a high-frequency, dual-tone input signal $V_{in}$. It is understood, however, that the invention is equally applicable in low-distortion amplification of input signals having more than two tones. Moreover, the present invention may be used for low-distortion amplification of a single tone input signal in situations where the amplifier elements used would otherwise tend to produce undesirable IMD components.

To illustrate the advantages of the present invention, linear amplifier equations are formed for each of three loops of circuit 30. All coefficients in the loop equations are in terms of voltage. For example, for a coupler C, $k1^2 + k2^2 = 1$, if coupler C is lossless, and is less than 1 if losses are considered.

Loop 1 has two paths that meet at NODE A:

Path 1: CO2-C1-β1-g1-C2-α3-C3

Path 2: CO2-C1-τ1-C3

For Path 1 of loop 1, signal $V_{in}$ passes through the direct path of a coupler CO2 and a coupler C1. Path 1 of loop 1 then includes an attenuation and phase adjust circuit β1, an amplifier g1, a coupler C2, an attenuator α3 and a coupling port of a coupler C3 before arriving at NODE A. Path 2 of Loop 1 includes the direct port of coupler CO2, the coupling port of coupler C1, a delay line τ1, and the direct port of coupler C3 before arriving at NODE A.

A spread signal INJECT 1 is input into path 1 of Loop 1 through the coupled port of a coupler CDI1. Spread signal INJECT 1 and a spread signal INJECT 2, which is input through a coupler CDI2 and is described below, are used for controlling loop 2. For analysis purposes, the amplitude and phase contributions of the through-path of couplers CDI1 and CDI2 are absorbed into the amplitude and phase adjust circuits $\beta 1 e^{j\psi 1}$ and $\beta 2 e^{j\psi 2}$, respectively.

The loop equation for path 1 of loop 1 is:

$$(k10e^{j\phi 10})(k1V_{in}e^{j\phi 1})(\beta 1 e^{j\psi 1})(g1 e^{j\theta 1})(k5 e^{j\phi 5})(\alpha 3 e^{j\tau 3})(k6 e^{j\phi 6}) \quad \} \text{ Main Term}$$

$$+\delta 1(k10e^{j\phi 10})(k1V_{in}e^{j\phi 1})(\beta 1 e^{j\psi 1})(g1 e^{j\theta 1})(k5 e^{j\phi 5})(\alpha 3 e^{j\tau 3})(k6 e^{j\phi 6}) \quad \} \text{ Dist. Term (1)}$$

where, the Main Term is the desired signal and Dist. Term is the distortion term.

The loop equation for loop 1, path 2 is:

$$(k10e^{j\phi 10})(k2V_{in}e^{j\phi 2})(\alpha 1 e^{j\tau 1})(k4 e^{j\phi 4}) \quad \} \text{ Main Term (2)}$$

The sum of the main terms of Eqs. (1) and (2) is set equal to $(k10e^{j\phi 10})(k1V_{in}e^{j\phi 1})$ at NODE A so that the distortion term of the signal input to amplifier g3, just prior to amplitude and phase adjust circuit $\beta 2 e^{j\psi 1}$, equals the main term of the signal input to amplifier g1, just prior to amplitude and phase adjust circuit $\beta 1 e^{j\psi 1}$. If amplifier g1 and amplifier g3 are identical and β1 and β2 are similarly identical, the same distortion terms will be produced by amplifier g1 and by amplifier g3. To ensure that the sum of the main terms of the signals appearing at NODE A equals $(k10e^{j\phi 10})(k1V_{in}e^{j\phi 1})$, signal DIFF.DET.1 and DIFF.DET.2 are input to couplers CDI1 and CDI2, respectively, for adjusting for any difference between the sum of the main terms and $(k10e^{j\phi 10})(k1V_{in}e^{j\phi 1})$.

Thus, at NODE A, $$V_{NODE\ A} = (k10e^{j\phi 10})(k1V_{in}e^{j\phi 1})(\beta 1 e^{j\psi 1})(g1 e^{j\theta 1})(k5 e^{j\phi 5})(\alpha 3 e^{j\tau 3})(k6 e^{j\phi 6}) \quad \} \text{ Main Term (Path 1)}$$

$$+(k10e^{j\phi 10})(k2V_{in}e^{j\phi 2})(\alpha 1 e^{j\tau 1})(k4 e_{j\phi 4}) \quad \} \text{ Main Term (Path 2)}$$

$$+\delta 1(k10e^{j\phi 10})(k1V_{in}^3 e^{j\phi 1})(\beta 1 e^{j\psi 1})(g1 e^{j\theta 1})(k1V_{in}e^{j\phi 5})(\alpha 3 e^{j\tau 3})(k6 e^{j\phi 6}) \quad \} \text{ Dist. Term (3)}$$

By setting the sum of the main terms of Eq. (3) equal to $(k10e^{j\phi 10})(k1V_{in}e^{j\phi 1})$, the $(k10e^{j\phi 10})$ terms cancel, resulting in:

$$k1V_{in}e^{j\phi 1} = V_{in}[(k1\beta 1 g1 k5 \alpha 3 k6)e^{j(\phi 1+\psi 1+\theta 1+\phi 5+\tau 3+\phi 6)} + (k2\alpha 1 k4)e^{j(\phi 2+\tau 1+\phi 4)}] \quad \} \text{ Main Term (4)}$$

The phase of the distortion term generated by g1, after passing through amplitude and phase adjust circuit $\beta 2 e^{j\psi 2}$ and through amplifier g3, should be 180° out-of-phase with the distortion term generated by amplifier g3 by amplifying the main term $k1V_{in}e^{j\theta 1}$ so that the distortion terms at the output of amplifier g3 cancel. Thus, $$\phi 1+\psi 2+\theta 3 = \phi 1+\psi 1+\theta 1+\phi 5+\tau 3+\phi 6+\psi 2+\theta 3+180° \quad (5)$$

Rewriting Eq. (5), $$-180° = \phi 5+\tau 3+\phi 6+\psi 1+\theta 1 \quad (6)$$

Substituting Eq. (6) into Eq. (4) yields, $$k1V_{in}e^{j\phi 1}=V_{in}[(-k1\beta 1g1k5\alpha 3k6)e^{j(\phi 1)}+(k2\alpha 1k4)e^{j(\phi 2+\tau 1+\phi 4)}] \quad (7)$$

Setting the phase terms of Eq. (7) equal to each other, $$\phi 1=\phi 1=\phi 2+\tau 1+\phi 4 \quad (8)$$

Solving Eq. (7) for the amplitude terms, $$k1=(k2\alpha 1k4)-(k1\beta 1g1k5\alpha 3k6) \quad (9)$$

Rewriting Eq. (9), $$(k2\alpha 1k4)=k1(1+\beta 1g1k5\alpha 3k6) \quad (10)$$

Using Eqs. (4), (6), (8) and (9), and rewriting Eq. (3), the voltage at NODE A is:

$$V_{NODEA}=k1k10V_{in}e^{j\phi 1}e^{j\phi 10}-\delta 1V^3_{in}k1\beta 1g1k5k10\alpha 3k6e^{j\phi 1}e^{j\phi 10} \quad (11)$$

The voltage at NODE A is ~$k1k10V_{in}e^{j\phi 1}e^{j\phi 10}$ because the distortion term ($V_{in}^3$ term) is small in comparison to the main term ($V_{in}$ term).

Ideally, the main voltage terms add in-phase at the output of circuit 30 and the distortion terms cancel.

Turning now to loop 2, there are two paths that meet at the output $V_o$:

Path 1: C2-τ2-C4
Path 2: β2-g3-C4

For path 1 of loop 2, input signal $V_{in}$ passes through the direct port of both couplers CO2 and C1. Path 1 of loop 2 then passes through attenuation and phase adjust circuit β1, amplifier g1, a direct port of coupler C2, a delay line τ2, a direct port of C4, and a direct port of coupler CO1 before arriving at $V_o$. Path 2 of loop 2 starts at NODE A and continues through the direct port of coupler CDI2, through an attenuation and phase adjust circuit β2, an amplifier g3, a coupling port of coupler C4, and the direct port of coupler CO1 before arriving at $V_o$. The amplitude and phase contribution of coupler CO1 is ignored because coupler CO1 contributes the same term to both paths 1 and 2 of loop 2.

The loop equation for path 1 of loop 2 is:

$$(k10e^{j\phi 10})(k1V_{in}e^{j\phi 1})(\beta 1e^{j\psi 1})(g1e^{j\theta 1})(k3e^{j\phi 3})(\alpha 2e^{j\tau 2})(k8e^{j\phi 8}) \quad \} \text{ Main Term}$$

$$+\delta 1(k10e^{j\phi 10})(k1V_{in}^3e^{j\phi 1})(\beta 1e^{j\psi 1})(g1e^{j\theta 1})(k3e^{j\phi 3})(\alpha 2e^{j\tau 2})(k8e^{j\phi 8}) \quad \} \text{ Dist. Term} \quad (12)$$

The loop equation for path 2 of loop 2 is:

$$(k10e^{j\phi 10})(k1V_{in}e^{j\phi 1})(\beta 2e^{j\psi 1})(g3e^{j\theta 3})(k7e^{j\phi 7}) \quad \} \text{ Main Term}$$

$$-\delta 1V_{in}^3(k1\beta 1g1k5\alpha 3k6\beta 2g3k7k10)e^{j(\phi+\psi 2+\theta 3+\phi 7+\phi 10)} \quad g_3\text{' Distortion Term}$$

$$+\delta 3V_{in}^3(k1k10\beta 2g3k7)e^{j(\phi 1+\psi 2+\theta 3+\phi 7+\phi 10)} \quad g_3\text{' Distortion Term} \quad (13)$$

At output $V_o$, the main terms add in-phase. Therefore, $$\phi 10+\phi 1+\psi 1+\theta 1+\phi 3+\tau 2+\phi 8=\phi 10+\phi 1+\psi 2+\theta 3+\phi 7 \quad (14)$$

Rewriting Eq. (14), $$\psi 1+\theta 1+\phi 3+\tau 2+\phi 8=\psi 2+\theta 3+\phi 7 \quad (15)$$

When g2 and g3 are identical and ψ1=ψ2, φ3+τ2+φ8=φ7. For the distortion terms to cancel, the amplitude terms must be equal and the phase terms must be equal because the distortion term in Eq. (13) already had a negative sign. From Eqs. (12) and (13), setting the phase of the distortion terms to be equal results in:

$$\phi 10+\phi 1+\psi 1+\theta 1+\phi 3+\tau 2+\phi 8=\phi 10+\phi 1+\psi 2+\theta 3+\phi 7 \quad (16)$$

Note, however, that Eq. (16) is the same as Eq. (14). From Eqs. (12) and (13), setting the amplitude of the distortion terms to sum to zero results in:

$$\delta 1k1k10\beta 1g1k3\alpha 2k8+\delta 3k1k10\beta 2g3k7-$$
$$\delta 1k1k10\beta 1g1k5\alpha 3k6\beta 2g3k7=0 \quad (17)$$

When g1 and g3 are identical and β1=β2, k3α2k8+k7= k5α3k6β2g3k7.

Finally, at the output $V_o$, the main term is:

$$V_o=(k10e^{j\phi 10})k1V_{in}e^{j\phi 1}(\beta 1e^{j\psi 1})(g1e^{j\theta 1})(k3e^{j\phi 3})(\alpha 2e^{j\tau 2})(k8e^{j\phi 8})$$

$$+k1V_{in}e^{j\phi 1}(k10e^{j\phi 10})(\beta 2e^{j\psi 2})(g3e^{j\phi 3})k7e^{j\phi 7}) \quad \} \text{ Main Term} \quad (18)$$

Rewriting Eq. (18) by using Eq. (16) results in:

$$V_o=k1V_{in}e^{j\phi 1}k10e^{j\phi 10}(\beta 1g1k3\alpha 2k8+\beta 2g3k7)e^{j(\psi 1+\theta 1+\phi 3+\tau 2+\phi 8)} \quad (19)$$

The third loop is used for monitoring and cancelling any distortion term present at $V_o$ that is caused by changes in component characteristics resulting from, for example, temperature variations and/or by component aging. To do this, the main terms of $V_{in}$ and $V_o$ are subtracted at a monitor port NODE B and a broadband diode detector D1 is used for detecting the remaining distortion term present at NODE B. An attenuation and phase adjust circuit β3 is then adjusted based on digital processing and control so that the main terms will cancel more effectively.

Once the main terms have been canceled, the remaining distortion signal, of which the INJECT 1 and INJECT 2 signals are part, is despread and detected by a narrowband detector. At this point, the detected spread tone is canceled by controlling attenuation and phase adjust circuit β2 of loop 2. By canceling, or minimizing, the spread tones, any distortion term at $V_o$ is also minimized.

Loop 3 has two paths that meet at NODE B:

Path 1: CO1-CO3
Path 2: CO2-β3-CO3-τ4

Path 1 of loop 3 passes through the coupling ports of coupler CO1 and a coupler CO3. Path 2 of loop 3 passes from the input through the coupling port of coupler CO2, through a delay line α4, through an attenuation and phase adjust circuit β3, and finally through the direct port of coupler CO3. The input signal to coupler CO1 is expressed in Eq. (19) as:

$$V_o=k1V_{in}e^{j\phi 1}k10e^{j\phi 10}(\beta 1g1k3\alpha 2k8+\beta 2g3k7)e^{j(\psi 1+\theta 1+\phi 3+\tau 2+\phi 8)} \quad (20)$$

The loop equation for path 1 of loop 3 is:

$$(k1V_{in}e^{j\phi 1}k10e^{j\phi 10}(\beta 1g1k3\alpha 2k8+\beta 2g3k7)e^{j(\psi 1+\theta 1+\phi 3+\tau 2+\phi 8)})(k15e^{j\phi 7})(k11e^{j\phi 11}) \quad (21)$$

The loop equation for path 2 of loop 3 is:

$$(k9V_{in}e^{j\phi 9})(\beta 3e^{j\psi 3})(k12e^{j\phi 12})(\alpha 4e^{j\tau 4}) \quad (22)$$

Summing Eqs. (20) and (21) results in:

$$V_{NODE\ B}=(k1V_{in}e^{j\phi 1}(\beta 1g1k3\alpha 2k8+\beta 2g3k7)e^{j(\psi 1+\theta 1+\phi 3+\tau 2+\phi 8)})(k15e^{j\phi 7})(k11e^{j\phi 11})$$

$$+(k9V_{in}e^{j\phi 9})(\beta 3e^{j\psi 3})(k12e^{j\phi 12})(\alpha 4e^{j\tau 4}) \quad (23)$$

The main terms in Eq. (23) are set to be equal in amplitude and cancel in phase by adjusting $\beta 3e^{j\psi 3}$.

What is claimed is:

1. An amplifier circuit, comprising:
   a first amplifier outputting a first signal, said signal including a first spread inject signal having at least one fundamental frequency signal and a first distortion signal;
   a second amplifier outputting a second signal, the second signal including a second spread inject signal and having a fundamental frequency signal corresponding to each fundamental frequency signal of the first signal and a second distortion signal, each fundamental frequency signal of the second signal being substantially in-phase with the corresponding fundamental frequency signal of the first signal, and the second distortion signal being substantially 180° out-of-phase with the first distortion signal;
   an output coupler combining the first and second signals to form a third signal having the corresponding fundamental frequency signals of the first and second signals constructively combined and a third distortion signal that is a difference between the first distortion signal and the second distortion signal; and
   a detector, coupled to the third signal, generating a control signal applied to the second amplifier for adjusting at least one of an amplitude and a phase of the second distortion signal, thereby minimizing the third distortion signal.

2. The amplifier circuit according to claim 1,
   wherein the detector detects the first spread inject signal and the second spread inject signal and generates the control signal based on the detected first spread inject signal and the second spread inject signal.

3. The amplifier circuit according to claim 1, wherein each fundamental frequency signal of the first signal has a first power level,
   wherein each fundamental frequency signal of the second signal has substantially the first power level, and
   wherein each fundamental frequency signal of the third signal has a power level that is substantially twice the first power level.

4. The amplifier circuit according to claim 1, wherein the first signal is a multi-tone signal.

5. The amplifier circuit according to claim 1, further comprising:
   a first coupler, coupled to the first signal, outputting a first coupled signal;
   a phase shifter, coupled to the first coupled signal, outputting a phase-delayed first coupled signal, the phase-delayed first coupled signal being phase delayed by a predetermined phase delay; and
   a second coupler, coupled to the phase-delayed first coupled signal, outputting at least a portion of an input signal for the second amplifier.

6. The amplifier circuit according to claim 5, wherein the predetermined phase delay is substantially 180°.

7. The amplifier circuit according to claim 5, wherein the second amplifier circuit includes an adjust circuit that varies at least one of an amplitude and a phase of the input signal for the second amplifier in response to the control signal.

8. The amplifier circuit according to claim 1, further comprising:
   a second coupler coupling an input signal to the first amplifier to the detector circuit; and
   a third coupler coupling the third signal to the detector circuit.

9. The amplifier circuit according to claim 1, wherein a gain of the first amplifier substantially equals a gain of the second amplifier.

10. A method of amplifying an input signal, the method comprising the steps of:
    forming a first input signal by combining a first spread inject signal with the input signal, the input signal having at least one fundamental frequency signal;
    amplifying the first input signal to produce a first amplified signal having at least one fundamental frequency signal and a first distortion signal;
    amplifying a second signal, wherein the second signal includes a second spread inject signal, to produce a second amplified signal having a fundamental frequency signal corresponding to each fundamental frequency signal of the first amplified signal and a second distortion signal, each fundamental frequency signal of the second amplified signal being substantially in-phase with the corresponding fundamental frequency signal of the first amplified signal and the second distortion signal by being substantially 180° out-of-phase with the first distortion signal;
    combining the first and second amplified signals to form a third signal having the corresponding fundamental frequency signals of the first and second amplified signals constructively combined and a third distortion signal that is a difference between the first distortion signal and the second distortion signal;
    detecting the amplitude level of the third distortion signal; and
    generating a control signal applied to the second amplifier for adjusting at least one of an amplitude and a phase of the second distortion signal for minimizing the third distortion signal.

11. The method according to claim 10,
    wherein the step of detecting the third distortion signal detects the first spread inject signal and the second spread inject signal, and
    wherein the step of generating the control signal generates the control signal based on the detected first spread inject signal and the second spread inject signal.

12. The method according to claim 10, wherein each fundamental frequency signal of the first amplified signal has a first power level,
    wherein each fundamental frequency signal of the second amplified signal has substantially the first power level, and
    wherein each fundamental frequency signal of the third signal has a power level that is substantially twice the first power level.

13. The method according to claim 10, wherein the first input signal is a multi-tone signal.

14. The method according to claim 10, further comprising the steps of:
    generating a first coupled signal based on the first amplified signal;
    phase-delaying the first coupled signal by a predetermined phase delay; and coupling the phase-delayed first coupled signal into the second input signal.

15. The method according to claim 14, wherein the predetermined phase delay is substantially 180°.

16. An Amplifier circuit, comprising:
   a first circuit loop including a first amplifier circuit outputting a first signal having at least one fundamental frequency signal, a first distortion signal, and a first spread inject signal;
   a second circuit loop including a second amplifier circuit outputting a second signal, a second distortion signal and a second spread inject signal, the second signal having a fundamental frequency signal corresponding to each fundamental frequency signal of the first signal and being substantially in phase with the corresponding fundamental frequency signal of the first signal; and
   a third circuit loop generating a control signal applied to the second amplifier for adjusting at least one of an amplitude and a phase of an input signal to the second amplifier circuit, the third circuit loop having an output coupler constructively combining the first signal and the second signal to form a third signal having a fundamental frequency signal corresponding to each fundamental frequency signal of the first and second signals and combining the first distortion signal and the second distortion signal to form a third distortion signal that is a minimized difference between the first distortion signal and the second distortion signal based on the control signal.

17. An amplifier circuit, comprising:
   a first circuit loop including a first amplifier circuit outputting a first signal having at least one fundamental frequency signal, a first distortion signal and a first spread inject signal;
   a second circuit loop including a second amplifier circuit outputting a second signal, a second distortion signal and a second spread inject signal, the second signal having a fundamental frequency signal corresponding to each fundamental frequency signal of the first signal and being substantially in-phase with the corresponding fundamental frequency signal of the first signal, the second amplifier circuit varying at least one of an amplitude and a phase of an input signal of the second amplifier circuit based on a difference between the first spread inject signal and the second spread inject signal; and
   an output coupler constructively combining the first signal and the second signal to form a third signal having the corresponding fundamental frequency signal of the first and second signals, and combining the first distortion signal and the second distortion signal to form a third distortion signal that has been minimized based on the difference between the first spread inject signal and the second spread inject signal.

* * * * *